United States Patent [19]
Ozawa

[11] Patent Number: 5,574,537
[45] Date of Patent: Nov. 12, 1996

[54] APPARATUS FOR CONTROLLING LIGHT QUANTITY USING ACOUSTO-OPTIC MODULATOR FOR SELECTING 0TH-ORDER DIFFRACTED BEAM

[75] Inventor: Ken Ozawa, Tokyo, Japan

[73] Assignee: Nikon Corporation, Tokyo, Japan

[21] Appl. No.: 227,237

[22] Filed: Apr. 13, 1994

[30] Foreign Application Priority Data

Apr. 15, 1993 [JP] Japan .................................. 5-088330

[51] Int. Cl.$^6$ .................................................. G03B 27/72
[52] U.S. Cl. .................................. 355/71; 355/53; 355/69
[58] Field of Search .................................. 359/285, 287, 359/305, 307, 315; 355/53, 67, 69, 71, 68

[56] References Cited

U.S. PATENT DOCUMENTS 4,362,364 12/1982 Smith ...................................... 359/285
5,067,798 11/1991 Tomoyasu ............................... 359/286
5,191,374 3/1993 Hazama et al. ........................... 355/43

FOREIGN PATENT DOCUMENTS 3-179357 8/1991 Japan .

Primary Examiner—David C. Nelms
Assistant Examiner—Andrew Q. Tran
Attorney, Agent, or Firm—Shapiro and Shapiro

[57] ABSTRACT

An apparatus for controlling a light quantity comprises a light source for emitting light and an acousto optical modulating element, having a driving unit for giving a progressive wave to a medium, for generating 0th-order and higher-order diffracted beams of light by an acousto optical effect of the progressive wave. The apparatus also comprises a stop element which transmits, not the higher-order diffracted beams, but the 0th-order diffracted beam; and a drive controlling section for varying a quantity of light irradiating an object by regulating the progressive wave through the driving unit.

25 Claims, 3 Drawing Sheets

APPARATUS FOR CONTROLLING LIGHT QUANTITY USING ACOUSTO-OPTIC MODULATOR FOR SELECTING 0TH-ORDER DIFFRACTED BEAM

BACKGROUND OF THE INVENTION

1. Field of the Invention

The present invention relates generally to a light quantity controlling apparatus for controlling a quantity of light emitted from a light source and, more particularly, to a light quantity controlling apparatus installed in an exposure apparatus and suitable for controlling an exposure quantity by making use of pulse laser beams of an excimer laser, etc. as exposure light, or modulation of energy of far ultraviolet light from a solid-state laser, etc. as exposure light.

2. Related Background Art

There has hitherto been developed an exposure apparatus in which a pulse laser light source serves as a light source for an exposure. A pulse laser beam, however, typically is unstable on the order of ±10% per pulse. Besides, the pulse laser beam exhibits such a phenomenon that laser power declines for a short or long period of time. For this reason, such an exposure apparatus has hitherto controlled an exposure quantity by a method involving detecting and adding up a light quantity per pulse beam and continuing an emission of light till a result of this integration comes to a desired value. This kind of conventional exposure quantity controlling method is classified roughly into two methods. One is a modification exposure method of effecting the exposure with pulse beams having a comparatively small light quantity after performing the exposure with pulse beams having a comparatively large light quantity to some extent. The other is a method of making an exposure energy substantially coincident with a predetermined average light quantity value with respect to all the pulse beams needed for one shot of exposure. Every method requires a light quantity regulating element for attenuating the pulse laser beams in terms of light quantity at a predetermined rate. The following are two types of known light quantity regulating elements.

A first example of the conventional light quantity regulating element will be explained. A plurality of attenuating filters having different transmittances are arranged at equiangular intervals to assume a revolver-like shape on a rotary plate. The rotary plate is rotated to make the laser beam incident on any one of the attenuating filters. The laser beam can be thereby discretely attenuated in terms of its intensity.

A second example of the conventional light quantity regulating element will be described. Two plane-parallel plates 3A, 3B have their transmittances which differ depending on an angle of incidence of an incident beam (angular characteristics). The plane-parallel plates 3A, 3B are, as illustrated in FIG. 4, arranged on an optical path of a laser beam LB. The thus arranged two plane-parallel plates 3A, 3B are intended to make an optical path of the laser beam LB when emitted coincident with an optical path when incident. In this case, one plane-parallel plate 3A is rotated clockwise through an angle θ with respect to a plane perpendicular to an optical axis of the laser beam LB. The other plane-parallel plate 3B is rotated counterclockwise through the angle θ. This angle θ is continuously varied, whereby the transmittance relative to the laser beam can be continuously changed.

There exists a case where a desired transmittance is obtained by the method in the first example in the above-mentioned light quantity regulating, per se but can not be necessarily accurately set to a transmittance required when controlling the exposure quantity in the exposure apparatus. Further, it is required that the rotary plate serving as a turret plate be mechanically rotationally driven when changing over the transmittance. This leads to drawbacks in that the changeover takes much time, and a throughput of the exposure step declines.

On the other hand, the transmittance can be continuously regulated by the method in the second example. There is, however, needed a synchronous drive for tilting the two plane-parallel plates in synchronism at the same angles in directions opposite to each other. This leads to a drawback in which the mechanism and the control system become complicated. Additional drawbacks are that response speed is unsatisfactory because of the method of mechanically changing the transmittance, and the throughput of the exposure step decreases.

SUMMARY OF THE INVENTION

It is a primary object of the present invention, which has been devised in view of the points given above, to provide a pulse-beam light quantity controlling apparatus for an exposure apparatus, the controlling apparatus being capable of continuously and rapidly changing transmittance of the pulse beam, without a mechanical drive.

A light quantity controlling apparatus according to the present invention comprises a light source for emitting light and an acousto optical modulating element, having a driving unit for giving a progressive wave to a medium, for generating 0th-order and higher-order diffracted beams of light by an acousto optical effect of this progressive wave. The light quantity controlling apparatus also comprises a stop element which transmits only the 0th-order diffracted beam generated by the acousto optical modulating element and a drive controlling section for varying a quantity of the light given to the object to be irradiated by adjusting the progressive wave through the driving unit.

If the irradiated object exhibits a photosensitivity, the drive controlling section controls the progressive wave to cause the light quantity to approximate a predetermined target exposure quantity.

Further, the light source involves the use of pulse beams. The drive controlling section controls the driving unit, and the light quantity of the 0th-order diffracted beam may be thus controlled for each pulse beam.

An exposure apparatus according to the present invention has a light source for emitting light, an illumination optical system for illuminating a first object formed with transfer patterns with the light and a projection optical system for transferring the patterns of the first object onto a second object with light from the illuminated first object. The exposure apparatus comprises an acousto optical modulating element, including a driving unit for giving a progressive wave to a medium and disposed in the illumination optical system, for generating 0th-order and higher-order diffracted beams of light from the light source by an acousto optical effect of this progressive wave. The exposure apparatus also comprises a stop element which transmits only the 0th-order diffracted beam generated by the acousto optical modulating element toward the first object. The exposure apparatus further comprises a drive controlling section for varying a quantity of the light given to the second object by adjusting the progressive wave through the driving unit.

The drive controlling section is capable of performing the control to irradiate the second object with a predetermined amount of light. The drive controlling section includes an exposure quantity monitor for detecting an exposure quantity of light falling on the second object. The drive controlling section controls the driving unit based on an integrated exposure quantity obtaining by adding up the exposure quantity detected by the exposure quantity monitor. The exposure quantity can be thus approximated to the predetermined target exposure quantity.

Further, the light quantity of the 0th-order diffracted beam can be also varied by making use of a Raman Nath diffraction region in the same way with the light quantity controlling apparatus.

The light source involves the use of pulse beams. The driving controlling section controls the driving unit. Thus, a pulse beam energy may be adjusted so that a pulse number of the pulse beams needed for the exposure becomes an integer. Alternatively, the pulse beam energy may be adjusted for each pulse beam.

If the pulse beam is far ultraviolet light (having a wavelength on the order of 300 nm or under), it is desirable that synthetic quartz be used as a progressive wave medium of the acousto optical modulating element.

According to the present invention described above, a final integrated exposure quantity of light on the second object is adjusted to the target exposure quantity. For this purpose, a light quantity of the pulse beam for a next exposure is controlled, based on the exposure quantity added up so far by means of the acousto optical modulating element. In this acousto optical modulating element, the pulse beams are diffracted by making use of the acousto optical effect of the progressive wave (ultrasonic wave). In this instance, an intensity of the progressive wave is varied by changing an amplitude of a drive signal for generating the progressive wave within, e.g., the acousto optical modulating element. Intensities of the higher-order diffracted beams (±1st-order diffracted beams, ±2nd-order diffracted beams, etc.) generated from the acousto optical modulating element are thereby varied. When the higher-order diffracted beams increase or decrease in their intensities, the intensity of the 0th-order diffracted beam varies substantially in reverse proportion thereto. Hence, the stop element selects the 0th-order diffracted beam, whereby the transmittance relative to the pulse beam can be substantially continuously varied.

That is, the intensity of the progressive wave in the acousto optical modulating element is modulated, thereby making it possible to continuously electrically vary the transmittance with respect to the pulse beam falling on the second object. Further, there is an advantage in that the time required for varying the transmittance can be reduced because no mechanical drive is involved. In this case, the following advantages are produced. The 0th-order diffracted beam is used for exposure, and, therefore, frequency of the beam falling on the second object does not change. If a projection optical system is used, there is no possibility of increasing chromatic aberration.

Moreover, when the pulse beam is far ultraviolet light, and if the synthetic quartz is employed as progressive wave medium of the acousto optical modulating element, the transmittance relative to the far ultraviolet pulse beam can be varied in a wide range with a high accuracy.

Further, the acousto optical modulating element has rapid response. Hence, the drive controlling section is capable of controlling the light quantity of every pulse beam falling on the second object through the acousto optical modulating element. The throughput of the exposure step can be thereby enhanced with a reduction in the exposure pulse number as a whole.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENT

Figure 1:
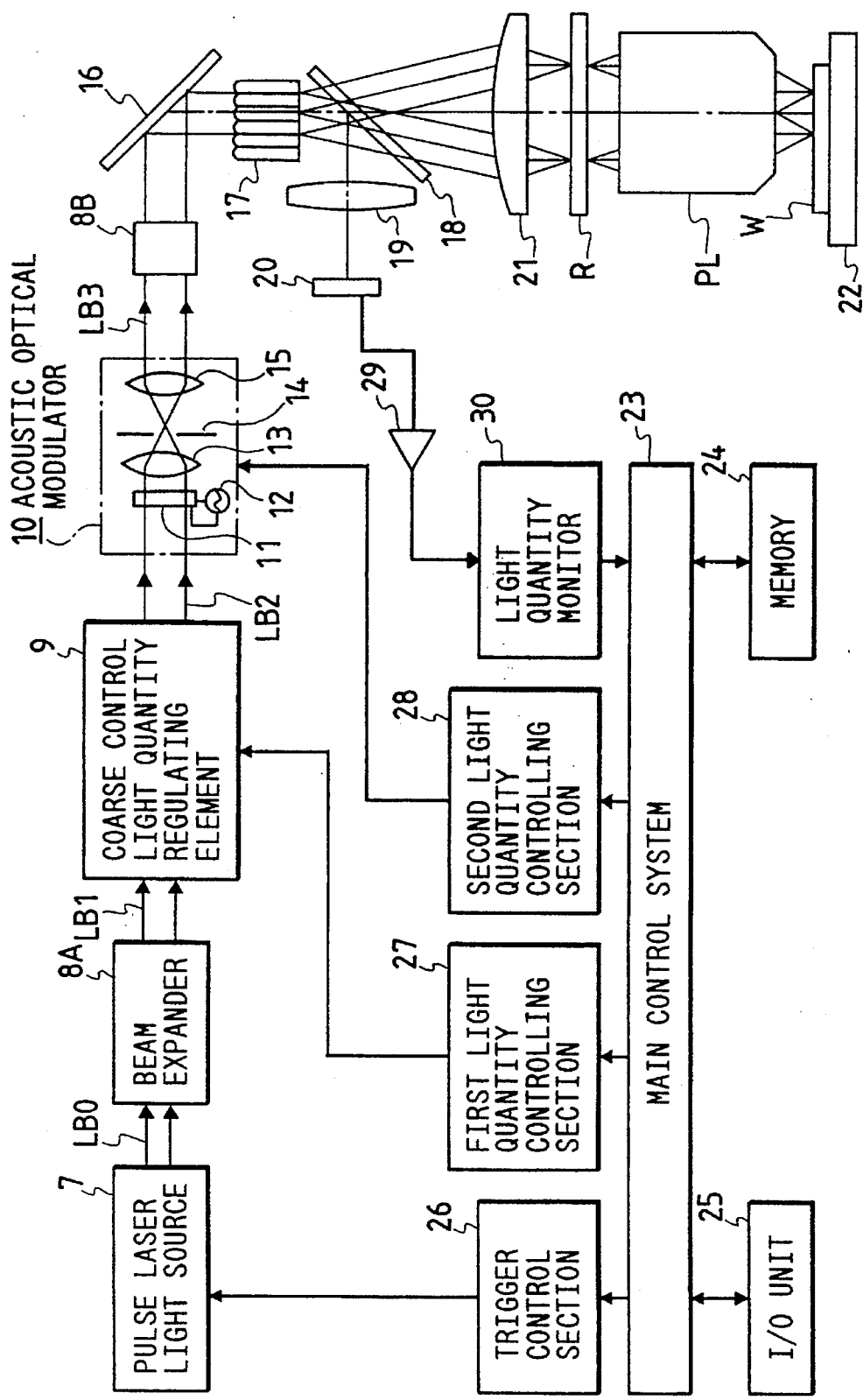
FIG. 1 is a view illustrating a projection exposure apparatus to which one embodiment of an exposure quantity controlling apparatus according to this invention is applied.

One embodiment of an apparatus for controlling an exposure quantity according to the present invention will hereinafter be described with reference to FIGS. 1 to 3. FIG. 1 illustrates a projection exposure apparatus equipped with the exposure quantity controlling apparatus in this embodiment. Referring to FIG. 1, a pulse laser light source 7 involves the use of a light source such as an excimer laser light source or the like for generating pulse beams of a far ultraviolet region (a wavelength is on the order of 300 nm or under). The pulse laser light source 7 has a band-narrowing wavelength stabilizing mechanism constructed of an etalon or a dispersion element. The band-narrowing wavelength stabilizing mechanism is provided in some portion between two resonant mirrors disposed at both ends so that a laser tube is sandwiched therebetween. The pulse laser light source 7 is constructed as a laser light source having a stable resonator. Further, a high-voltage discharge is caused between two electrodes provided in parallel along an optical axis of the laser beam, thereby emitting ultraviolet pulse laser beams. The ultraviolet pulse laser beams such KrF excimer laser beams having a wavelength of, e.g., 248 nm photosensitize a wafer resist layer which will be mentioned later.

Figure 4:
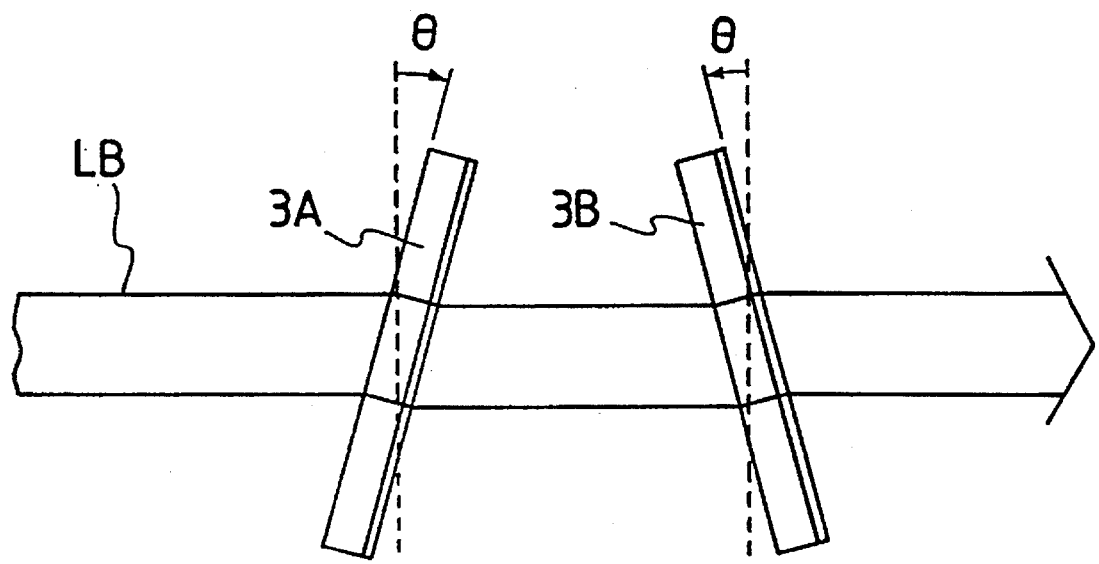
FIG. 4 is a diagram showing an example of a conventional light quantity regulating element.

A laser beam LB0 emitted from the pulse laser light source 7 is incident on a beam expander 8A. The laser beam LB0 assumes such a rectangular configuration in section that an aspect ratio is on the order of ½ to ⅕ corresponding to a state of layout of the two electrodes. The laser beam LB0, after being shaped to a desired beam size by the beam expander 8A, falls in the form of a laser beam LB1 on a coarse control light quantity regulating element 9. The coarse control light quantity regulating element 9 may involve the use of a turret type rotary plate or the like as shown in FIG. 4, wherein transmittance varies discretely. A laser beam LB2 is obtained when attenuated at a predetermined rate (including a transmittance of 100%) in the coarse control light quantity regulating element 9. The laser beam LB2 is incident on an acousto optical modulator 10 defined as a fine control light quantity regulating element. A modulation band width of intensity in the acousto optical modulator 10 depends on a size of the incident beam. The beam expander 8A is therefore designed in accordance with the modulation band width demanded by the acousto optical modulator 10. A beam shaping optical system 8B is. disposed posterior to the acousto optical modulator 10. The beam shaping optical system 8B illuminates a fly eye lens 17 with the beam having a desired size.

In the acousto optical modulator 10, the laser beam LB2 falls on an ultrasonic cell 11 in which an ultrasonic progressive wave is produced by a driving unit 12. Accordingly, 0th-order, ±1st-order and ±2nd-order diffracted beams of the laser beam LB2 are produced in the ultrasonic cell 11. These diffracted beams are led via a condenser lens 13 onto a stop 14. The stop 14 is formed with an aperture which admits only the 0th-order diffracted beam among the diffracted beams of the laser beam LB2. The 0th-order diffracted beam passing through this aperture is collimated by a collimator lens 15. A collimated beam is emitted outside in the form of a laser beam LB3. In this case, the intensity of the 0th-order diffracted beam varies due to an amplitude (power) of the ultrasonic wave within the ultrasonic cell 11 (the details will be stated later). The intensity of the laser beam LB3 emitted from the acousto optical modulator 10 is attenuated at a predetermined rate with respect to the intensity of the incident laser beam LB2. That is, the acousto optical modulator 10 functions as a light quantity modulator for the incident laser beam LB2.

The laser beam LB3 undergoing a desired light quantity modulation is, after passing through the beam shaping optical system 8B, reflected by an ultraviolet reflecting mirror 16 and incident on the fly eye lens 17. A multiplicity of secondary illuminants are formed on a focal plane on the rear side (reticle side) of the fly eye lens 17. Laser beams from those secondary illuminants penetrate a beam splitter 18 having a small reflectivity. The beam splitter 18 is so disposed as to be inclined at an inclination angle of 45° to the optical axis. The laser beams are thereafter condensed to a proper extent by means of a condenser lens 21. A reticle R is illuminated with the condensed laser beams in superposition. Images of circuit patterns on the reticle R are thereby transferred onto the resist layer of a wafer W held on a wafer stage 22 via a projection optical system PL.

By the way, the laser beams split by the beam splitter 18 upon the reflection therefrom are converged on a light receiving surface of a light receiving element 20 via a convergence optical system 19. The light receiving element 20 works to exactly output a photoelectric conversion signal corresponding to a light quantity (pulse energy) of every laser pulse beam. The light receiving element 20 is constructed of PIN photo diodes exhibiting a sufficient sensitivity in the ultraviolet region and a sufficiently high response speed. The photoelectric conversion signals of the light receiving element 20 are supplied via an amplifier 29 to a light quantity monitor 30.

A main control system 23 controls operations of the whole projection exposure apparatus in this embodiment. A memory 24 for storing various items of information is connected to the main control system 23. Connected also to the main control system 23 is an I/O unit 25 for receiving a command from the operator and outputting information to the operator. The main control system 23 controls oscillation states (a number of light emission pulses, an oscillation interval, etc.) of the pulse laser light source 7 through a trigger control section 26. Further, a first light quantity control section 27 controls, e.g., a rotary motion of the rotary plate incorporating a variety of filters in the interior of the coarse control light quantity regulating element 9. A second light quantity control section 28 controls an intensity and a frequency of the ultrasonic wave within the ultrasonic cell 11 of the acousto optical modulator 10. The main control system 23 sets the transmittances of the coarse control light quantity regulating element 9 and of the acousto optical modulator 10 to values calculated in the following procedures through the light quantity control sections 27, 28.

Furthermore, the photoelectric conversion signals of the light receiving element 20 are supplied via the amplifier 29 to the light quantity monitor 30. The light quantity monitor 30 sequentially adds up (integrates) the signals supplied pulsewise from the light receiving element 20 during one shot exposure on the wafer W. The main control system 23 is supplied with an integration signal obtained by the integration. A conversion ratio of the photoelectric conversion signal from the light receiving element 20 to an exposure energy quantity on the wafer W is obtained beforehand by an actual measurement. This conversion ratio is stored in memory 24. Hence, the main control system 23 is capable of monitoring an actual integrated exposure quantity on the wafer W midways of the exposure.

Given next is an explanation of a principle of the modulation of the light intensity of the laser beam in the acousto optical modulator 10 in this embodiment. The acousto optical modulator 10 modulates the light intensity by an acousto optical effect.

Figure 2:
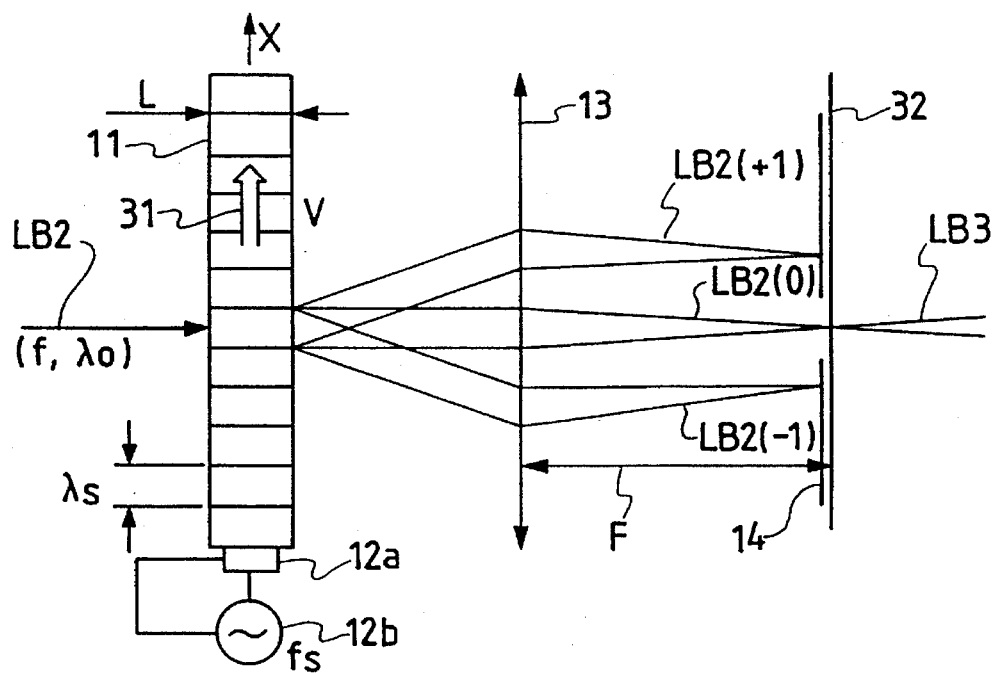
FIG. 2 is a block diagram showing principal elements of an acousto optical modulator 10 of FIG. 1.

FIG. 2 illustrates a configuration of the acousto optical modulator 10 in the vicinity of the ultrasonic cell 11. Referring to FIG. 2, a transducer 12a is fixed to one end of the ultrasonic cell 11. The transducer 12a is supplied with a drive signal from an oscillator 12b. The transducer 12a and the oscillator 12b are combined to constitute the driving unit 12 of FIG. 1. In this instance, a drive signal of the oscillator 12b is converted into a mechanical oscillation by means of the transducer 12a. An ultrasonic wave (progressive wave) 31 generated by the oscillation of the transducer 12a progresses toward the other end (this is termed an [x-direction]) within the ultrasonic cell 11. A refractive index within the ultrasonic cell 11 defined as a medium periodically varies due to the ultrasonic wave 31, thereby forming a phasic diffraction grating. The laser beam LB2 is diffracted by this diffraction grating, with the result that the 0th-order diffracted beam LB2(0), the +1st-order diffracted beam LB2(+1), the −1st-order diffracted beam LB2(−1), . . . are emitted from the ultrasonic cell 11.

Synthetic quartz exhibiting an elasto optical effect may be used as a material of the ultrasonic cell 11 when the wavelength region of the laser beam LB2 is a far ultraviolet region of the KrF excimer laser beam, etc.. If the laser beam LB2 is a He-Ne laser beam, tellurium dioxide ($TeO_2$) may be used for the ultrasonic cell 11. Considered hereinbelow is a case where the incident laser beam LB2 is the KrF excimer laser beam having a wavelength of 248 nm. To start with, let f be the frequency of the incident laser beam LB2, and let $\lambda_0$ be the wavelength in the air. Based on this assumption, let $f_s$ be the frequency of the ultrasonic wave 31 travelling in the x-direction within the ultrasonic cell 11, let $\lambda_s$ be the wavelength, and let v be the velocity.

The refractive index n of the ultrasonic cell (medium) 11 with respect to the incident laser beam LB2 slightly varies due to the elasto optical effect. A variation quantity of the refractive index n is proportional to a distortion of the ultrasonic wave. The variation quantity $\Delta n$ (x, t) of the refractive index n at the time t in the position x within the ultrasonic cell 11 can be expressed such as:

$$\Delta n\ (x,\ t) = \Delta n_p \cos\ (2\pi f_s t - k_s x) \qquad (1)$$

where $\Delta n_p$ is the peak value of the variation quantity. In this formula, $k_s = 2\pi/\lambda_s$ is the wave number of the ultrasonic wave 31. The medium refractive index n varies with the same period with the wavelength $\lambda_s$ of the ultrasonic wave. A distribution of this refractive index n is equivalent to the phasic diffraction grating with respect to the laser beam LB2. Considered herein is a Raman-Nath region in which the frequency $f_s$ of the ultrasonic wave is comparatively small. In this Raman-Nath region, the following relationship is substantially established:

$$K_s^2 \cdot L/k_0 \leq 0.3 \quad (2)$$

where L is the width of the ultrasonic cell 11 in the traveling direction of the laser beam LB2, $n_0$ is the refractive index of the ultrasonic cell 11 when applying no ultrasonic wave, and $k_0$ ($=2\pi n_0/\lambda_0$) is the wave number of the laser beam LB2 within the medium having the refractive index $n_0$.

In this case, it is considered that the ultrasonic cell 11 is compressed in a direction along the width L. The ultrasonic cell 11 can be regarded as a single piece of thin phasic diffraction grating. As illustrated in FIG. 2, there can be seen a diffraction phenomenon of the ultrasonic cell 11 with respect to the laser beam LB2. From a theory of the diffraction grating, the diffraction angle $\theta_m$ of an mth-order diffracted beam (m is an integer) of the laser beam LB2 is given as below:

$$\theta_{m=sin}^{-1} (m \cdot \lambda_0/\lambda_s) \quad (3)$$

The mth-order diffracted beam is condensed on a so-called Fourier spectral plane 32 through a condenser lens 13. The stop 14 is disposed on this Fourier spectral plane 32. Considering an intensity distribution on the Fourier spectral plane, the diffraction efficiency $\eta_m$ of the mth-order diffracted beam is defined as a value of ratio of the intensity of the mth-order diffracted beam to the intensity of 0th-order diffracted beam when applying no ultrasonic wave. The diffraction efficiency $\eta_m$ is expressed by the following formula:

$$\eta_m = \{J_m (\Delta\phi_p)\}^2 \quad (4)$$

where the function $J_m$ is an mth-order cylinder function of the first kind (Bessel function), and $\Delta\phi_p$ is the phase lag of the emitted beam due to a variation quantity $\Delta n_p$ of the refractive index within the ultrasonic cell 11, the variation quantity $\Delta n_p$ of the refractive index being defined as a quantity controlled by the power (intensity) of the ultrasonic wave. The phase lag $\Delta\phi_p$ is expressed by the following formula:

$$\Delta\phi_p = 2\pi\Delta n_p L/\lambda_0 \quad (5)$$

Now, supposing that f is the rear-side focal length of the condenser lens 13, a spectrum of the mth-order diffracted beam can be seen in such a position an x-directional distance from the optical axis is $\{m (\lambda_0/\lambda_s) f\}$ on the Fourier spectral plane 32. Herein, the diffracted beams other than the 0th-order diffracted beam LB2(0) are intercepted by the stop 14, thereby transmitting only the 0th-order diffracted beam LB2(0). At this time, let $I_0$ be the intensity of the 0th-order diffracted beam LB2(0) when applying no ultrasonic wave to the ultrasonic cell 11. The intensity $I_0$ may be equalized to an incident light quantity when scatter is not caused in the ultrasonic cell 11. Then, the intensity I of the 0th-order diffracted beam LB2(0) when applying the ultrasonic wave to the ultrasonic cell 11 is given as follows:

$$I = I_0 \cdot \{J_0 (\Delta\phi_p)\}^2 \quad (6)$$

Figure 3:
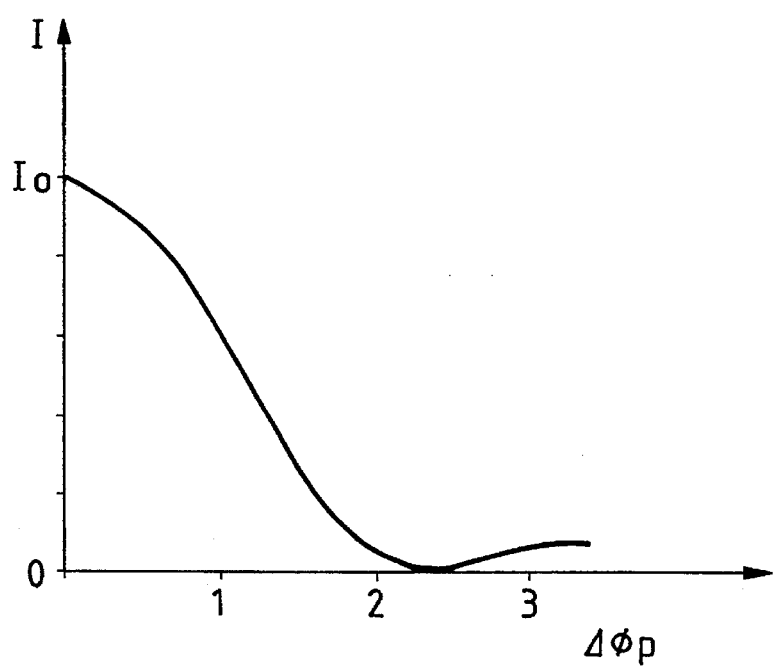
FIG. 3 is a diagram showing a relationship of a phase lag $\Delta\phi_p$ versus an intensity I of a 0th-order diffracted beam emitted, this phase lag depending on an intensity of an ultrasonic wave within the acousto optical modulator 10 in the embodiment.

FIG. 3 shows the intensity I of the 0th-order diffracted beam LB2(0) with respect to the phase lag $\Delta\phi_p$. As illustrated in FIG. 3, the transmittance with respect to the incident laser beam can be continuously varied within a range of 100%–0%. The thus intensity-modulated 0th-order diffracted beam LB2(0) is emitted outside in the form of a laser beam LB3 from the aperture of the field stop 14. That is, according to the acousto optical modulator 10 in this embodiment, the amplitude of the drive signal supplied from the oscillator 12b to the transducer 12a is regulated, whereby the transmittance with respect to the incident laser beam LB2 can be electrically continuously varied in a range of 100%–0%.

In this instance, there exists a possibility of accumulating the energy of the laser beam within the ultrasonic cell 11 or undergoing an exothermic influence from the transducer. Under such a circumstance, it is desirable to cool off the ultrasonic cell 11 by use of, e.g., a Peltier element, etc..

Further, paying attention to FIG. 2, the frequency of the 0th-order diffracted beam LB2(0) is the same as the frequency when incident. The mth-order diffracted beams (m=±1,±2, . . .) are, however, respectively subjected to the frequency modulation of $mf_s$. Hence, in the case of using such mth-order diffracted beams, there is a possibility of causing chromatic aberration in the projection optical system PL of FIG. 1. In contrast with this, the 0th-order diffracted beam is employed in this embodiment. Accordingly, there is no possibility of producing new chromatic aberration due to the acousto optical modulator 10. Particularly in the exposure apparatus using an exposure wavelength of the ultraviolet region, chromatic aberration in the projection optical system is hard to compensate. For this reason, it is feasible to effect the exposure with no deterioration in terms of image quality which is involved in chromatic aberration by use of the 0th-order diffracted beam.

Speaking further of response speed, if it is assumed that the ultrasonic cell 11 of FIG. 2 is composed of synthetic quartz, a sonic velocity of the internal ultrasonic wave is approximately 6 Km/sec. Then, if an x-directional length of the ultrasonic cell 11 is set to several cm, the response frequency is approximately several MHz, wherein the response frequency is defined as an inverse number of the time from a change in amplitude of the drive signal of the oscillator 12b to an actual change in intensity of the laser beam LB2(0). In addition, the oscillation frequency of the pulse beam from the pulse laser light source 7 of FIG. 1 is on the order of 500 Hz as one example. When using the acousto optical modulator 10 in this embodiment, however, the intensity of the pulse beam can be changed with an allowance between the emissions of the pulse beams from the pulse laser light source 7.

Next, a method of controlling an exposure quantity will be discussed. Several methods as the exposure quantity controlling method can be considered. However, the simplest method of integrating the pulse energy will be contemplated. To begin with, referring to FIG. 1, the wafer W is placed on the wafer stage 22. Before starting an exposure on the wafer W, the coarse control light quantity regulating element 9 and the acousto optical modulator 10 are respectively initialized to maximize their transmittances; i.e., the acousto optical modulator 10 is initialized in a state where no ultrasonic wave is applied. Next, an exposure energy falling on the wafer W is set to $S_0$m J/m$^2$. When an exposure energy $S_0$ is inputted from the I/O unit 25, the main control system 23 starts the emission of the pulse beams from the pulse laser light source 7 through the trigger control section 26. Then, the light quantity monitor 30 calculates an average pulse energy <P> conceived as an average value of the exposure energy (pulse energy) P per pulse beam on the wafer W from an integrated value of the pulse energy of several hundreds of pulses.

According to a simple pulse energy integrating method, an accuracy of an integrated value of the pulse energy of N-streaks of pulse beams is expressed such as $(\delta P/\langle P\rangle)/N^{1/2}$, where $\delta P$ is the stability of the pulse energy. The accuracy of the integrated value of the pulse energy falls within a desired accuracy A. For this purpose, the minimum value Nc of the pulse number N is given by:

$$Nc=\{(\delta P/\langle P\rangle)/A\}^2 \qquad (7)$$

Further, when using beams such as laser beams exhibiting a high coherence, interference fringes are formed on the wafer W. In this exposure method, a minimum value of a finally required pulse number N is max $(N_c, N_m)$, where $N_m$ is the pulse number required at the minimum when averaging the interference fringes at intervals of several pulses with vibrations of a mirror disposed in a principal optical path. The symbol max (a, b) represents a larger number of the numbers a and b. A minimum value thereof is expressed by $N_{min}$. Namely, the following formula is established:

$$N \geq N_{min} = \max (N_c, N_m) \qquad (8)$$

Next, from the measured average pulse energy $\langle P\rangle$, the pulse number N needed for the exposure is obtained by the following formula:

$$N = S_0/\langle P\rangle \qquad (9)$$

If this pulse number N is smaller than $N_{min}$, the main control system 23 gives an indication via the first light quantity control section 27 to perform such attenuating as to establish $(N \geq N_{min})$ in the coarse control light quantity regulating element 9. The, memory 24 stores, in the form of a table, a relationship of the transmittance versus the phase lag $\Delta\phi_p$ (i.e., retains a function of power versus transmittance) depending on the intensity (power) of the ultrasonic wave which is shown in FIG. 3. The main control system 23 sets the intensity of the ultrasonic wave within the ultrasonic cell 11 of the acousto optical modulator 10 so that the pulse number N needed for the exposure becomes an integer through the second light quantity control section 28. The transmittance with respect to the laser beam LB2 in the acousto optical modulator 10 is thereby finely controlled. The average pulse energy $\langle P\rangle$ is thus finely controlled.

With an end of the above energy control, the main control system 23 places the wafer W to be exposed on the wafer stage 22. The main control system 23 causes the pulse laser light source 7 to start emitting the pulse laser beams through the trigger control section 26. Subsequently, when the wafer W is irradiated with N-streaks of pulse laser beams, one shot of exposure is finished.

By the way, one of characteristics of the acousto optical modulator 10 is an excellent response speed because of controlling the light quantity by adjusting the power of the ultrasonic wave without performing a mechanical drive. Accordingly, the acousto optical modulator 10 in this embodiment is applicable to an exposure quantity controlling apparatus for controlling the pulse energy per pulse as disclosed in Japanese Patent Application Laid-Open No. 3-179357 (U.S. Pat. Ser. No. 623,176, filed on Dec. 5, 1990). The exposure quantity controlling apparatus disclosed in Japanese Patent Application Laid-Open No. 3-179357 (U.S. Pat. Ser. No. 623,176, filed on Dec. 5, 1990) controls the light quantity by regulating a voltage applied to the laser light source. An easier method is the method of controlling the light quantity by the acousto optical modulator 10 as in the present embodiment. In the invention, it can be considered that instability in the pulse energy of the pulse beams emitted from the laser light source is reduced (The energy does not decline in terms of scatter duel to a deflection of HV).

According to the method of controlling the light quantity by regulating the applied voltage, the light quantity of the laser beams stable in terms of the stability in the pulse energy of the pulse beams when an energy given to the laser light source is, e.g., 10 mJ is made variable by giving an energy of, e.g., 8 mJ with the control of the applied voltage. Consequently, instability in the pulse energy increases. In addition, the high applied voltage has to be controlled, resulting in an increase in size of the apparatus and a complicated structure thereof. Contrastingly, in the invention, the light quantity of the pulse beams emitted from the laser light source is controlled by adjusting the intensity of the ultrasonic wave within the ultrasonic cell 11. Therefore, the pulse energy of the pulse beams emitted from the laser light source is not deteriorated in terms of the stability, with the result that instability in the pulse energy is smaller than in the case of controlling the applied voltage. The apparatus is simplified enough to make the control easier.

The initial state of the acousto optical modulator 10 when controlling the light quantity per pulse beam is determined by, e.g., a stability in control of the acousto optical modulator 10 itself as well as by the stability in the pulse energy. If it is assumed that an adjustment range (dynamic range) of the transmittance that is required for controlling the energy per pulse beam is set to $\pm 15\%$, the power of the ultrasonic wave is set to obtain a transmittance of 85% in the initial state of the acousto optical modulator in this embodiment. Performed further from this state is the fine control of the energy for setting the pulse number to an integer as stated earlier. On this occasion, the pulse number is set to the integer by use of the acousto optical modulator 10 to decrease the transmittance.

The above statement touches on a series of actions conducted before the exposure. From this state, an energy adjustment per pulse beam is implemented through the acousto optical modulator 10 as disclosed in Japanese Patent Application Laid-Open No. 3-179357 (U.S. Pat. Ser. No. 623,176, filed on Dec. 5, 1990). Based on the method of effecting the control for each pulse beam, the minimum value of the exposure pulse number needed for obtaining a desired exposure quantity accuracy can be reduced under the minimum value Nc expressed by the formula (7) in the case of the integration method. Accordingly, the minimum exposure pulse number can be decreased. This is remarkably effective in enhancing throughput of the exposure step when using a high-sensitivity resist.

Moreover, this acousto optical modulator is also, it is apparent, usable for the above-mentioned modification exposure method. High-speed attenuating can be attained by the acousto optical modulator during one shot of exposure. Note that the light quantity is controlled on the principal optical path of the laser beam LB2 by use of the acousto optical modulator 10 in the embodiment discussed above. However, the acousto optical modulator 10 may be used when controlling the light quantity on an optical path other than the principal optical path. The pulse laser light source 7 is employed as a light source for the exposure light in the embodiment discussed above. When using, e.g., a continuous oscillation laser light source or the like, however, the light quantity of the laser beams may be controlled by use of the acousto optical modulator 10.

Further, the ultrasonic cell 11 of FIG. 2 is used in the Raman-Nath diffraction region (expressed such as $L<n\lambda_s^2/$ $\lambda_0$). It is, however, apparent that the intensity of the 0th-order diffracted beam can be similarly modulated by employing a Bragg diffraction region (expressed by $L>n\lambda_s^2/\lambda_0$). Note that the Bragg diffraction is applied to such an arrangement that the acousto optical modulator 10 is disposed at a predetermined angle to the optical axis of the laser beam LB2. Moreover, a solid-state laser is usable for emitting the laser beam LB2 in this embodiment. Even when employing this solid-state laser, the intensity of the 0th-order diffracted beam can be modulated by making use of the Bragg diffraction. As discussed above, the present invention is not restricted to the above embodiment; a variety of configurations can be taken without departing from the gist and scope of the present invention.

What is claimed is:

1. In an exposure apparatus having, in the following sequence along an optical path:
    a light source for emitting light;
    an illumination optical system that illuminates a first object formed with a transfer pattern with light emitted by said light source; and
    a projection optical system that transfers the pattern of the first object onto a second object by projecting onto the second object light from the illuminated pattern,
    the improvement wherein said illumination optical system comprises:
        an acousto-optical modulator, having a medium exhibiting an acousto-optical effect and a driving unit that generates a progressive wave in said medium to emit diffracted light beams by diffracting light from said light source which is incident on said medium;
        a diffracted beam selector that selects a 0th-order diffracted beam from said diffracted light beams to irradiate said first object; and
        a drive controlling section that is connected to said driving unit and that varies a quantity of light projected onto said second object by controlling said driving unit.

2. The apparatus according to claim 1, wherein said drive controlling section controls the intensity of the progressive wave through said driving unit.

3. The apparatus according to claim 1, wherein said diffracted beam selector comprises a stop which transmits the 0th-order diffracted beam but not higher order diffracted beams.

4. The apparatus according to claim 1, wherein said light source is a laser light source that emits pulse beams and said drive controlling section controls said driving unit so that a pulse number of the pulse beams needed for an exposure becomes an integer.

5. The apparatus according to claim 4, wherein said drive controlling section controls a one-pulse exposure quantity of the pulse beams by controlling the intensity of the progressive wave.

6. The apparatus according to claim 4, wherein said light source emits pulse beams of far ultraviolet light, and said medium is synthetic quartz.

7. An exposure apparatus according to claim 1, wherein said drive controlling section controls said driving unit to adjust said quantity of light to a desired exposure amount.

8. A light quantity control apparatus comprising, in the following sequence along an optical path:
    a light source that emits light; and
    a medium on which light from said light source is incident; and further comprising:
        a driving unit that is coupled to said medium and that generates a periodic change of a refractive index in said medium to diffract said incident light and emit a 0th-order diffracted light beam; and
        a drive controlling section that is connected to said driving unit and that adjusts a light quantity of said 0th-order diffracted light beam by changing the value of the refractive index by said driving unit.

9. An apparatus for controlling a light quantity, comprising, in the following sequence along an optical path:
    a light source that emits light;
    an acousto-optical modulator having a driving unit that generates a progressive wave in an acousto-optical medium to emit diffracted light beams by diffracting light emitted by said light source which is incident on said medium, by an acousto-optical effect of said progressive wave; and
    a diffracted beam selector that selects a 0th-order diffracted light beam from said diffracted light beams; and further comprising:
        a drive controlling section that is connected to said driving unit and that controls said progressive wave through said driving unit.

10. The apparatus according to claim 9, wherein said drive controlling section controls the intensity of the progressive wave through said driving unit.

11. The apparatus according to claim 9, wherein said diffracted beam selector comprises a stop which transmits the 0th-order diffracted beam but not higher order diffracted beams.

12. The apparatus according to claim 9, wherein said light source emits pulse beams, and said 0th-order diffracted light beam is a pulse beam, and said drive controlling section controls said progressive wave to adjust an amount of light in said 0th-order pulse beam to a desired amount.

13. A light quantity controlling method comprising the following steps:
    step 1 in which light emitted from a light source is made incident on a medium which is able to generate an acousto-optical effect;
    step 2 in which a progressive wave is generated by said medium and said light is diffracted;
    step 3 in which 0th-order diffracted light is selected from said diffracted light; and
    step 4 in which the intensity of said progressive wave is controlled to change a light quantity of said diffracted light.

14. A method according to claim 13, wherein, in said step 1, pulse light is emitted from said light source.

15. A method according to claim 13, wherein:
    said step 4 includes monitoring the light quantity of said diffracted light and controlling the intensity of said progressive wave based on a result of monitoring.

16. A method according to claim 15, wherein, in said step 1, pulse light is emitted from said light source.

17. A method according to claim 15, wherein:
    in said step 1, a plurality of pulses of pulse light are emitted from said light source; and
    in said step 4, the intensity of said progressive wave is controlled for each pulse of said pulse light.

18. A method according to claim 15, wherein
    in said step 1, a plurality of pulses of pulse light are emitted from said light source; and
    in said step 4, the intensity of said progressive wave is so controlled that the intensity of each pulse of said pulse light is adjusted.

19. An exposure amount control method for radiating light emitted from a light source onto a first object and transferring onto a photosensitive second object a pattern formed on the first object, comprising the following steps:

step 1 in which a plurality of pulses of pulse light are emitted from the light source;

step 2 in which said pulse light is made incident on a medium which is able to generate an acousto-optical effect;

step 3 in which a progressive wave is generated by said medium to diffract the incident light;

step 4 in which 0th-order diffracted light is selected from the diffracted light;

step 5 in which an intensity of said progressive wave is so controlled that the number of pulses of pulse light required for exposure is an integer; and step 6 in which the pulse light of said number of pulses is radiated onto the first object.

20. A method according to claim 19, wherein, in said step 5, a light quantity of said 0th-order diffracted light is monitored, and based thereon the intensity of said progressive wave is so controlled that the number of pulses of the pulse light required for exposure is an integer.

21. A method according to claim 19, wherein, in said step 5, the intensity of said progressive wave is so controlled that a light quantity of each pulse of said pulse light is adjusted at a predetermined rate.

22. An exposure amount control method for radiating light emitted from a light source onto a first object and transferring onto a photosensitive second object a pattern formed on said first object, comprising the following steps:

step 1 in which light is emitted from the light source;

step 2 in which said light is made incident on a medium which is able to generate an acousto-optical effect;

step 3 in which a progressive wave is generated by said medium to diffract the incident light;

step 4 in which only 0th-order diffracted light is selected from said diffracted light;

step 5 in which a light quantity of said 0th-order diffracted light is monitored; and step 6 in which, based on an integrated value of the monitored light quantity, the intensity of said progressive wave is controlled.

23. A method according to claim 22, wherein, in said step 1 a plurality of pulses of pulse light are emitted from the light source; and in said step 6 the intensity of said progressive wave is controlled for each light pulse so that the integrated value of said light quantity is close to a target value for every pulse.

24. A method according to claim 22, wherein said step 6 includes a process for controlling the intensity of said progressive wave so that a difference between the integrated value of said light quantity and a target value determines the amount of incident light.

25. A method according to claim 22, wherein in said step 1 a plurality of pulses of pulse light are emitted from said light source; and in said step 6, the integrated value of the light quantity and a target value required for exposure are compared, and based on the result thereof, the intensity of said progressive wave is controlled for each pulse.

* * * * *